(12) United States Patent
Higuchi et al.

(10) Patent No.: US 7,310,874 B2
(45) Date of Patent: Dec. 25, 2007

(54) METHOD FOR MANUFACTURING A POTASSIUM NIOBATE DEPOSITED BODY

(75) Inventors: Takamitsu Higuchi, Nagano (JP); Setsuya Iwashita, Nagano (JP); Hiromu Miyazawa, Nagano (JP)

(73) Assignee: Seiko Epson Corporation (JP)

( * ) Notice: Subject to any disclaimer, the term of this patent is extended or adjusted under 35 U.S.C. 154(b) by 403 days.

(21) Appl. No.: 11/079,241

(22) Filed: Mar. 14, 2005

(65) Prior Publication Data

US 2005/0206271 A1 Sep. 22, 2005

(30) Foreign Application Priority Data

Mar. 17, 2004 (JP) ............................. 2004-076609

(51) Int. Cl.
*H01R 9/00* (2006.01)
*H01L 41/00* (2006.01)
*B05D 5/12* (2006.01)

(52) U.S. Cl. .................... 29/842; 29/830; 29/832; 29/843; 29/846; 310/311; 427/126.3; 427/100; 427/117

(58) Field of Classification Search ............... 29/842, 29/846, 830, 831, 832, 843; 310/311, 320, 310/313 A, 313 R, 358, 361; 427/126.3, 427/100, 117
See application file for complete search history.

(56) References Cited

U.S. PATENT DOCUMENTS

| 5,498,920 | A | * | 3/1996 | Okano et al. ............ 310/313 A |
| 5,850,410 | A | * | 12/1998 | Kuramata ................ 372/43.01 |
| 6,190,752 | B1 | * | 2/2001 | Do et al. .................... 428/141 |
| 6,510,597 | B2 | * | 1/2003 | Yoshida et al. ............ 29/25.35 |
| 6,720,846 | B2 | | 4/2004 | Iwashita et al. |
| 2004/0000840 | A1 | | 1/2004 | Higuchi et al. |

FOREIGN PATENT DOCUMENTS

| JP | 2001-185988 | 7/2001 |
| JP | 2001-196892 | 7/2001 |
| JP | 2003-017981 | 1/2003 |
| JP | 2003-273705 | 9/2003 |
| JP | 2003-273706 | 9/2003 |
| JP | 2003-289230 | 10/2003 |

* cited by examiner

*Primary Examiner*—A. Dexter Tugbang
*Assistant Examiner*—Tai van Nguyen
(74) *Attorney, Agent, or Firm*—Harness, Dickey & Pierce, P.L.C.

(57) ABSTRACT

A potassium niobate deposited body includes a substrate, an electrode layer formed above the substrate, and a potassium niobate layer formed above the electrode layer. The potassium niobate layer can include a domain that epitaxially grows in a (110) or (001) orientation, when a lattice constant of orthorhombic potassium niobate is $2^{1/2}$ c<a<b, and a b-axis is a polarization axis.

9 Claims, 9 Drawing Sheets

TRANSMITTER 80,
TRANSMISSION SIGNAL
PROCESSING CIRCUIT 81,
TRANSMISSION MIXER 82,
TRANSMISSION FILTER 83,
TRANSMISSION POWER
AMPLIFIER 84,
TRANSCEIVER WAVE DIVIDER
85, ANTENNAS 86a, 86b,
LOW NOISE AMPLIFIER 87,
RECEPTION FILTER 88,
RECEPTION MIXER 89,
RECEPTION SIGNAL
PROCESSING CIRCUIT 90,
RECEIVER 91,
FREQUENCY SYNTHESIZER 92,
CONTROL CIRCUIT 93, and
IPUT/DISPLAY CIRCUIT 94

METHOD FOR MANUFACTURING A POTASSIUM NIOBATE DEPOSITED BODY

RELATED APPLICATIONS

This application claims priority to Japanese Patent Application No. 2004-076609 filed Mar. 17, 2004 which is hereby expressly incorporated by reference herein in its entirety.

BACKGROUND

1. Technical Field

The present invention relates to potassium niobate deposited bodies, methods for manufacturing the same, piezoelectric thin film resonators, frequency filters, frequency oscillators, electronic circuits, and electronic apparatuses, which are used in, for example, telecommunications equipment.

2. Related Art

Accompanying the considerable increase in transmission rate in the telecommunications field such as cellular phones and wireless LANs, the transmission frequency is advancing toward higher frequencies in several GHz band and several tens GHz band regions. In the field of technology where such higher frequency rates are expected, piezoelectric thin film resonators (i.e., film bulk acoustic resonators: FBARs) are attracting more attention than surface acoustic wave elements that have been used as frequency filters in the past. Because the development of piezoelectric thin film resonators is also directed toward achieving further miniaturization and higher efficiency, like the direction of development of surface acoustic wave elements, a larger electromechanical coupling coefficient is needed. When a piezoelectric thin film resonator is used as a high frequency filter, in particular, when an ultra wide band is needed as in the case of a UWB (ultra wide band) system, a higher electromechanical coupling coefficient is needed in order to obtain a passband region with a low loss and a wide bandwidth.

Recently, it was found that potassium niobate ($KNbO_3$) (a=0.5695 nm, b=0.5721 nm, and c=0.3973 nm; hereafter this index expression is followed as orthorhombic crystal) single crystal exhibited a large value of electromechanical coupling coefficient. When a, b and c axial directions are assumed to be 1, 3 and 2 directions, respectively, an electromechanical coupling coefficient in a shear distortion mode around the a-axis when an electric filed is impressed in the c-axis direction (i.e., $k_{24}$) attains a very large value of 46%. Accordingly, it is expected that a piezoelectric thin film resonator having an excellent electromechanical coupling coefficient may be manufactured using this potassium niobate as a thin film. However, there is no technology known to date to form a potassium niobate single phase thin film on a substrate of a large surface area.

It is an object of the present invention to provide a potassium niobate deposited body wherein a polycrystal or single crystal potassium niobate thin layer is formed on a substrate, and a method for manufacturing the same.

It is another object of the present invention to provide a piezoelectric thin film resonator that can be accommodated for higher frequency applications and has a high electromechanical coupling coefficient, with which the effect of miniaturization and power saving can be expected.

It is still another object of the present invention to provide a frequency filter, a frequency oscillator, an electronic circuit, and an electronic apparatus, which include the piezoelectric thin film resonator described above.

SUMMARY

A potassium niobate deposited body in accordance with the present invention includes:

a substrate;

an electrode layer formed above the substrate; and a potassium niobate layer or a potassium niobate solid solution layer formed above the electrode layer.

In accordance with the present invention, a potassium niobate deposited body in which a potassium niobate thin film having a high electromechanical coupling coefficient is formed on a substrate can be provided.

It is noted that, in the present invention, forming "B" above "A" includes a case in which "B" is formed directly on "A," and a case in which "B" is formed over "A" through a member different from "A" or "B."

In the potassium niobate deposited body in accordance with the present invention, the potassium niobate layer can include a domain that epitaxially grows in a (110) or (001) orientation, when a lattice constant of orthorhombic potassium niobate is $2^{1/2}$ c<a<b, and a b-axis is a polarization axis.

In the potassium niobate deposited body in accordance with the present invention, the layer of potassium niobate solid solution consists of a solid solution shown by $K_{1-x}Na_xNb_{1-y}Ta_yO_3$ (0<x<1, 0<y<1).

A method for manufacturing a potassium niobate deposited body in accordance with the present invention includes:

a step of forming a buffer layer consisting of a metal oxide having a rock salt structure on a first substrate consisting of a sapphire substrate;

a step of forming a potassium niobate polycrystal or single crystal layer or a potassium niobate solid solution layer above the buffer layer;

a step of forming an electrode layer above the potassium niobate layer;

a step of bonding a second substrate above the electrode layer; and a step of isolating the first substrate by removing the buffer layer by etching.

In the method for manufacturing a potassium niobate deposited body in accordance with the present invention, because the buffer layer consisting of a metal oxide having a rock salt structure is included above the sapphire substrate, a potassium niobate layer having an excellent crystallinity can be obtained.

In the method for manufacturing a potassium niobate deposited body in accordance with the present invention, the potassium niobate layer can include a domain having a polarization axis that is in parallel with the sapphire substrate. Also, in accordance with the present invention, the potassium niobate layer can include a domain that epitaxially grows in a (110) or (001) orientation, when a lattice constant of orthorhombic potassium niobate is $2^{1/2}$ c<a<b, and a b-axis is a polarization axis. In accordance with the present invention, the potassium niobate layer, as having the domain described above, has a high electromechanical coupling coefficient.

In the method for manufacturing a potassium niobate deposited body in accordance with the present invention, the sapphire substrate can be an R plane (1-102). By using such a sapphire substrate, a buffer layer that epitaxially grows can be obtained.

In the method for manufacturing a potassium niobate deposited body in accordance with the present invention, the metal oxide can be magnesium oxide. Further, the magnesium oxide can be epitaxially grown in a cubic (100)

orientation. By using such a buffer layer, a polycrystal or single crystal potassium niobate layer can be formed.

A method for manufacturing a potassium niobate deposited body according to claim 9, wherein a [100] direction vector of the magnesium oxide, and a [110] direction vector of the domain epitaxially grown to a (110) orientation or a [001] direction vector of the domain epitaxially grown to a (001) orientation of the potassium niobate layer are inclined with respect to a normal vector of the R-plane (1-102) of the sapphire substrate. The tilt angle with respect to the normal vector can be 1 degree or greater but 20 degrees or smaller.

The method for manufacturing a potassium niobate deposited body in accordance with the present invention can further include the step of polishing a surface of the potassium niobate layer or the potassium niobate solid solution layer.

A piezoelectric thin film resonator in accordance with the present invention includes:

a substrate having a void section;

a first electrode layer formed above the substrate;

a potassium niobate layer or a potassium niobate solid solution layer formed above the first electrode layer; and a second electrode layer formed above the potassium niobate layer or the potassium niobate solid solution layer, wherein the first and second electrode layers are located at least above the void section.

In the piezoelectric thin film resonator in accordance with the present invention, a surface of the potassium niobate layer or the potassium niobate solid solution layer may be polished.

A frequency filter in accordance with the present invention includes a piezoelectric thin film resonator in accordance with the present invention.

A frequency oscillator in accordance with the present invention includes a piezoelectric thin film resonator in accordance with the present invention.

An electronic circuit in accordance with the present invention includes a frequency oscillator in accordance with the present invention.

An electronic apparatus in accordance with the present invention includes at least one of a frequency filter in accordance with the present invention, a frequency oscillator in accordance with the present invention, and an electronic circuit in accordance with the present invention.

DETAILED DESCRIPTION

An embodiment of the present invention is described below with reference to the drawings.

1. Potassium Niobate Deposited Body and Its Manufacturing Method

FIGS. 1(A)-(E) are cross-sectional views schematically indicating a potassium niobate deposited body in accordance with an embodiment of the present invention, and its manufacturing method.

1.1 Potassium Niobate Deposited Body

Figure 1:
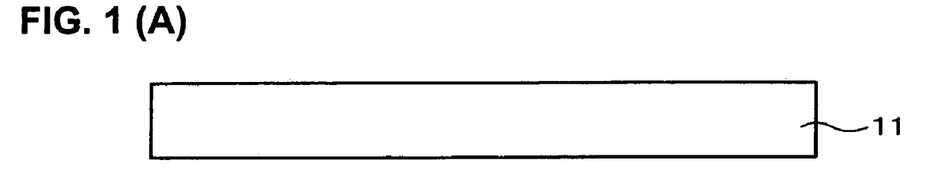
FIGS. 1(A)-(E) are cross-sectional views showing a potassium niobate deposited body in accordance with an embodiment of the present invention and its manufacturing method.

As shown in FIG. 1(E), a potassium niobate deposited body 100 in accordance with the present embodiment includes a substrate 15, an electrode layer 14 formed on the substrate 15, and a potassium niobate layer 13 formed on the electrode layer 14.

The material of the substrate 15 is not particularly limited, and can be any material that can be patterned by etching or the like. As the substrate 15, for example, a silicon substrate, a photosensitive glass such as a glass substrate, a metal substrate, a resin substrate, or the like can be enumerated. Also, the film thickness of the substrate 15 is appropriately selected according to devices to which the potassium niobate deposited body in accordance with the present embodiment is applied.

The material of the electrode layer 14 is not particularly limited, and can use a well-known material. For example, an electrode material such as Pt, Ir, IrOx, $SrRuO_3$, Nb—$SrTiO_3$, La—$SrTiO_3$, Nb—(La,Sr) $CoO_3$ or the like can be used for the electrode layer 14. It is noted here that Nb—$SrTiO_3$ is $SrTiO_3$ doped with Nb, La—$SrTiO_3$ is $SrTiO_3$ doped with La, and Nb—(La,Sr) $CoO_3$ is (La,Sr) $CoO_3$ doped with Nb. Among these materials, a metal oxide is desirous as a material for the electrode layer 14 because the metal oxide excels in conductivity and chemical stability, and can be formed into a film by vapor phase deposition.

The potassium niobate layer 13 has a polycrystal or single crystal structure. The thickness of the potassium niobate layer 13 is not particularly limited, and appropriately selected depending on devices to be applied, but for example, it can be 10 nm or greater but 10000 nm or smaller. Also, the potassium niobate layer 13 may preferably include a domain that epitaxially grows in a (0$\bar{0}$1) orientation, when the lattice constant of orthorhombic potassium niobate is $2^{1/2}$ c<a<b and a b-axis is a polarization axis. The potassium niobate layer 13 including such a domain can have a high electromechanical coupling coefficient.

In the present embodiment, instead of the potassium niobate layer described above, it may be a layer of potassium niobate solid solution in which a part of niobium and potassium of potassium niobate is replaced with other elements. As the potassium niobate solid solution, for example, a solid solution shown by $K_{1-x}Na_xNb_{1-y}Ta_yO_3$ ($0<x<1$, $0<y<1$) can be enumerated. The same similarly applies to embodiments to be described below.

1.2 Method for Manufacturing Potassium Niobate Deposited Body

Next, a method for manufacturing a potassium niobate deposited body is described.

(1) As shown in FIG. 1(A), a sapphire single crystal substrate 11 (first substrate) is prepared. The sapphire single crystal substrate 11 has been degreased and washed beforehand. Degreasing and washing can be conducted through soaking the sapphire single crystal substrate in an organic solvent with an ultrasonic washing machine. The organic solvent is not particularly limited, but may be a mixed solution of ethyl alcohol and acetone.

An R-plane (1-102) substrate can be used as the sapphire single crystal substrate 11. Such a sapphire single crystal substrate is desirable because a large area substrate with which the buffer layer 12 and the potassium niobate layer 13 can be epitaxially grown can be obtained at a low cost, and in addition, it has a tolerance to etchant and can be used repeatedly.

(2) A buffer layer 12 that consists of MgO is formed on the sapphire single crystal substrate 11 by a laser ablation method, as shown in FIG. 1(B).

More specifically, after the sapphire single crystal substrate 11 that has been degreased and washed is loaded onto a substrate holder, it is introduced together with the substrate holder in a vacuum apparatus whose back pressure at room temperature is $1\times10^{-8}$ Torr. Next, oxygen gas is introduced such the oxygen partial pressure becomes $5\times10^{-5}$ Torr, for example, and then the substrate is heated to elevate its temperature up to 400° C. at a rate of 20° C./minute with an infrared ray lamp. It is noted that the conditions such as the rate of temperature elevation, substrate temperature, pressure, etc. are not limited to the above.

Next, a plume is generated by a laser ablation method in which a laser beam is irradiated to a magnesium target for a buffer layer, thereby pounding out magnesium atoms from the target. Then, this plume is irradiated toward the sapphire single crystal substrate 11, and contacts the sapphire single crystal substrate 11, whereby MgO with a cubic (100) orientation is formed by epitaxial growth on the sapphire single crystal substrate 11.

The thickness of the buffer layer 12 is not particularly limited, but may be 5 nm or greater but 100 nm or less, in view of preventing the sapphire single crystal substrate 11 and the potassium niobate layer 13 from reacting each other, and preventing the potassium niobate layer 13 from being deteriorated because of deliquescence of magnesium oxide itself. By using MgO with a cubic (100) orientation as the buffer layer 12, a potassium niobate layer that has a specific domain to be described below can be obtained.

The benefit in using MgO with a cubic (100) orientation as the buffer layer 12 is not only that MgO can epitaxially grow a potassium niobate layer 13 on the sapphire single crystal substrate 11, but also that the dielectric property of the potassium niobate layer 13 is not deteriorated even when $Mg^{2+}$ substitutes $Nb^{5+}$ in the potassium niobate layer 13 and K (Mg, Nb) $O_3$ is generated.

As the method to pound out magnesium atoms or desired atoms from a target in a later step, besides the method of irradiating a laser beam to a target surface described above, for example, a method of irradiating (injecting) argon gas (inert gas) plasma or an electron beam to a target surface can also be used. However, the method of irradiating a laser beam to a target surface is desirable among them. According to such a method, atoms can be readily and securely pounded out from a target, with a vacuum apparatus of a simple structure equipped with an incident window of a laser beam.

The laser beam to be irradiated to a target may preferably be a pulsed beam with a wavelength of about 150-300 nm, and a pulse length of about 1-100 ns. More specifically, the laser beam may be, for example, an excimer laser such as an ArF excimer laser, a KrF excimer laser, a XeCl excimer laser, or the like, a YAG laser, a $YVO_4$ laser, a $CO_2$ laser or the like. Among the above, the ArF excimer laser and the KrF excimer laser are particularly preferred. The ArF excimer laser and the KrF excimer laser are easy to handle, and can effectively pound atoms from the first target.

Each of the conditions at the time of laser beam irradiation is not particularly limited as long as the magnesium plasma can sufficiently reach the substrate, and MgO as the buffer layer can be epitaxially grown.

For example, the conditions at the time of laser beam irradiation are as follows. The energy density of the laser beam may preferably be between 2 $J/cm^2$ and 4 $J/cm^2$. The frequency of the laser beam may preferably be between 5 Hz and 20 Hz. The distance between the target and the substrate may preferably be between 30 mm and 100 mm. The temperature of the substrate may preferably be between 300° C. and 600° C. The partial pressure of oxygen during deposition may preferably be between $1\times10^{-5}$ Torr and $1\times10^{-3}$ Torr.

(3) As shown in FIG. 1(C), a potassium niobate layer 13 is formed by a laser ablation method on the buffer layer 12.

More specifically, a plume is generated by a laser ablation method in which a laser beam is irradiated to a target for a potassium niobate layer, for example, a $K_{0.6}Nb_{0.4}O_y$ target, thereby pounding out potassium, niobium and oxygen atoms from this target. Then, the plume is irradiated toward the sapphire single crystal substrate 11, and contacts the buffer layer 12, whereby a potassium niobate layer 13 is formed on the buffer layer 12.

In the laser ablation method, the conditions at the time of laser beam irradiation are not particularly limited as long as the potassium and niobium plasma can sufficiently reach the substrate. For example, the conditions may be as follows. The energy density of the laser beam may preferably be between 2 $J/cm^2$ and 4 $J/cm^2$. The frequency of the laser beam may preferably be between 5 Hz and 20 Hz. The distance between the target and the substrate may preferably be between 30 mm and 100 mm. The temperature of the substrate may preferably be between 600° C. and 800° C. The partial pressure of oxygen during deposition may preferably be between $1\times10^{-2}$ Torr and 1 Torr.

The potassium niobate layer 13 that can be obtained in the process described above can have the following characteristics.

That is, the potassium niobate layer 13 can include a domain whose polarization axis is in parallel with the sapphire single crystal substrate 11.

More specifically, the potassium niobate layer 13 may preferably include a domain that epitaxially grows in a (001) orientation, when the lattice constant of orthorhombic potassium niobate is $2^{1/2}$ c<a<b and a b-axis is a polarization axis. The potassium niobate layer 13 including such a domain can have a high electromechanical coupling coefficient.

In addition, as described below in detail, when the potassium niobate layer 13 consists of a single crystal, a [100] direction vector of the magnesium oxide composing the buffer layer 12, and a [110] direction vector of the domain epitaxially grown to a (110) orientation or a [001] direction vector of the domain epitaxially grown to a (001) orientation of the potassium niobate layer 13 may preferably be inclined with respect to a normal vector of the R-plane (1-102) of the sapphire substrate. The inclination angle with respect to the normal vector may preferably be 1 degree or greater but 20 degrees or less.

(4) As shown in FIG. 1(D), an electrode layer 14 consisting of, for example, SrRuO3 is formed on the potassium niobate layer 13.

More specifically, after lowering the temperature of the substrate 11 to 300° C., a plume is generated by a laser ablation method in which a laser beam is irradiated to the surface of a SrRuO$_3$ target to pound out Sr, Ru and O atoms. Then, the plume is irradiated toward to the sapphire single crystal substrate 11, and comes in contact with the potassium niobate layer 13, whereby the electrode layer 14 consisting of SrRuO$_3$ is formed through epitaxial growth.

Each of the conditions at the time of laser beam irradiation is not particularly limited as long as Sr and Ru plasma can sufficiently reach the substrate, and a SrRuO3 layer can be epitaxially grown. For example, the conditions at the time of laser beam irradiation are as follows. The energy density of the laser beam may preferably be between 2 J/cm$^2$ and 4 J/cm$^2$. The frequency of the laser beam may preferably be between 5 Hz and 20 Hz. The distance between the target and the substrate may preferably be between 30 mm and 100 mm. The temperature of the substrate may preferably be between 200° C. and 400° C. The partial pressure of oxygen during deposition may preferably be between $1 \times 10^{-3}$ Torr and $10^{-1}$ Torr.

(5) As shown in FIG. 1(D), a substrate 15 (second substrate) is bonded onto the electrode layer 14. As the method of bonding the substrate 15 to the electrode layer 14, for example, a bonding method using adhesive such as epoxy adhesive or the like, solder, gold-gold, gold-aluminum or other intermetallic solid bonding methods, or the like, can be used. The substrate 15 can consist of, for example, any material that can be patterned by etching or the like, such as, for example, a silicon substrate, a photosensitive glass substrate, or the like.

(6) As shown in FIG. 1(E), by wet-etching the buffer layer 12, the sapphire single crystal substrate 11 is separated from a laminated body of the potassium niobate layer 13, the electrode layer 14, and the second substrate 15.

For the wet-etching, a liquid that resolves only the buffer layer 12, and does not adversely affect the other layers is used. For example, because MgO is used as the buffer layer 12 in the present embodiment, an acidic solution such as phosphoric acid, nitric acid or the like can be used as an etchant.

In accordance with the present embodiment, by selecting each of the conditions at the time of laser ablation, potassium niobate becomes to have a polycrystal (preferably polycrystal of a single phase) or single crystal structure.

Through the steps described above, a potassium niobate deposited body 100 in which the electrode layer 14 and the potassium niobate layer 13 are sequentially deposited on the substrate 15 is obtained.

In addition, a polishing process to planarize the surface of the potassium niobate layer 13 can be conducted if necessary. Buff polishing, CMP (Chemical Mechanical Polishing) or the like can be used as such a polishing process.

In the above-described process, a $K_{0.6}Nb_{0.4}O_y$ target is used in the step (3) for forming the potassium niobate layer 13. However, the composition ratio of the target is not limited to the above. For example, for the formation of the potassium niobate layer, it is possible to use a target having a composition ratio that is suitable for conducting a Tri-Phase-Epitaxy method, in which a vapor phase raw material is deposited on a substrate that is maintained at temperatures in a solid-liquid coexisting region, and a solid phase is precipitated from a liquid phase. Concretely, when the temperature and the mole composition ratio at an eutectic point E of $KNbO_3$ and $3K_2O.Nb_2O_5$ under a prescribed oxygen partial pressure are assumed to be $T_E$ and $x_E$, respectively, (x is a mole composition ratio of potassium (K) and niobium (Nb) when they are expressed by $K_xNb_{1-x}O_y$), a plasma plume that is a raw material in the state of a vapor phase is supplied to a base substrate (which, in this example, consists of a sapphire substrate and a buffer layer formed on the substrate), such that the composition x in the state of a liquid phase immediately after being deposited on the base substrate is in the range of $0.5 \leq x \leq x_E$. When a complete melting temperature at this oxygen partial pressure and the composition x is assumed to be $T_m$, and the temperature $T_s$ of the base substrate is maintained within the range of $T_E \leq T_s \leq T_m$, $KNbO_3$ single crystal can be precipitated from $K_xNb_{1-x}O_y$ on the base substrate, while evaporating the remaining liquid of $K_xNb_{1-x}O_y$ deposited on the base substrate from the plasma plume 24.

It is noted that, in the present embodiment, a laser ablation is used as a film forming method for forming the buffer layer 12, the potassium niobate layer 14 and the electrode layer 14. However, the film forming method is not limited to this, and, for example, a vapor deposition method, a MOCVD method, and a sputter method can be used.

According to the manufacturing method of the present embodiment, after the potassium niobate layer 13 that requires a temperature of about 600-800° C. is formed, the substrate temperature is once lowered to, for example, 300° C., and then the electrode layer 14 is formed, and further the substrate 15 can be bonded to the electrode layer 14 by means of adhesive or the like. In this manner, after the potassium niobate layer 13 is formed, the potassium niobate layer 13 does not have to be exposed to a high temperature, such that compositions of the electrode layer would not deteriorate the potassium niobate layer through diffusion.

1.3 Embodiment Examples (1) First Embodiment Example

A potassium niobate deposited body was formed by the following method. In this embodiment example, a polycrystal potassium niobate layer of a single phase could be obtained.

First, a sapphire single crystal substrate was degreased and washed through soaking the sapphire single crystal substrate in an organic solvent with an ultrasonic washing machine. As the organic solvent, a 1:1 mixed solution of ethyl alcohol and acetone was used. After loading the sapphire single crystal substrate that had been degreased and washed onto a substrate holder, it was introduced together with the substrate holder in a vacuum apparatus whose back pressure at room temperature was $1 \times 10^{-8}$ Torr, oxygen gas was introduced such the oxygen partial pressure became $5 \times 10^{-5}$ Torr, and then the substrate was heated to elevate its temperature up to 400° C. at a rate of 20° C./minute with an infrared ray lamp.

Next, a pulsed beam of KrF excimer laser (with a wavelength of 248 nm) was injected in a surface of a magnesium target under conditions with an energy density being 3

J/cm$^2$, a frequency being 10 Hz, and a pulse length being 10 ns, thereby generating a plasma plume of magnesium on the target surface. The plasma plume was irradiated to the sapphire single crystal substrate at a position 70 mm away from the target for 30 minutes under conditions with a substrate temperature being 400° C. and an oxygen partial pressure being 5×10$^{-5}$ Torr, whereby an epitaxially grown buffer layer consisting of MgO was deposited to a thickness of 10 nm.

Next, a pulsed beam of KrF excimer laser was injected in a surface of a K$_{0.6}$Nb$_{0.4}$O$_y$ target under conditions with an energy density being 3 J/cm$^2$, a frequency being 10 Hz, and a pulse length being 10 ns, thereby generating a plasma plume of K, Nb and O. The plasma plume was irradiated to the sapphire single crystal substrate at a position 70 mm away from the target for 240 minutes under conditions with a substrate temperature being 750° C. and an oxygen partial pressure being 1×10$^{-1}$ Torr, whereby a potassium niobate layer was deposited to a thickness of 1 μm on the buffer layer.

Next, after the temperature of the substrate was lowered to 300° C., a pulsed beam of KrF excimer laser was injected in a surface of a SrRuO$_3$ target under conditions with an energy density being 3 J/cm$^2$, a frequency being 10 Hz, and a pulse length being 10 ns, thereby generating a plasma plume of Sr, Ru and O. The plasma plume was irradiated to the sapphire single crystal substrate at a position 70 mm away from the target for 60 minutes under conditions with a substrate temperature being 300° C. and an oxygen partial pressure being 1×10$^{-2}$ Torr, whereby an electrode layer consisting of a SrRuO$_3$ layer was deposited to a thickness of 100 nm. Then, a silicon substrate was bonded onto the electrode layer by using an adhesive (epoxy adhesive), whereby a laminated body was obtained.

Then, the laminated body obtained was soaked in a phosphoric acid solution to etch the buffer layer consisting of MgO, whereby the sapphire single crystal substrate was separated. In this manner, a potassium niobate deposited body in which the electrode layer and the potassium niobate layer are successively deposited on the silicon substrate was obtained.

Figure 2:
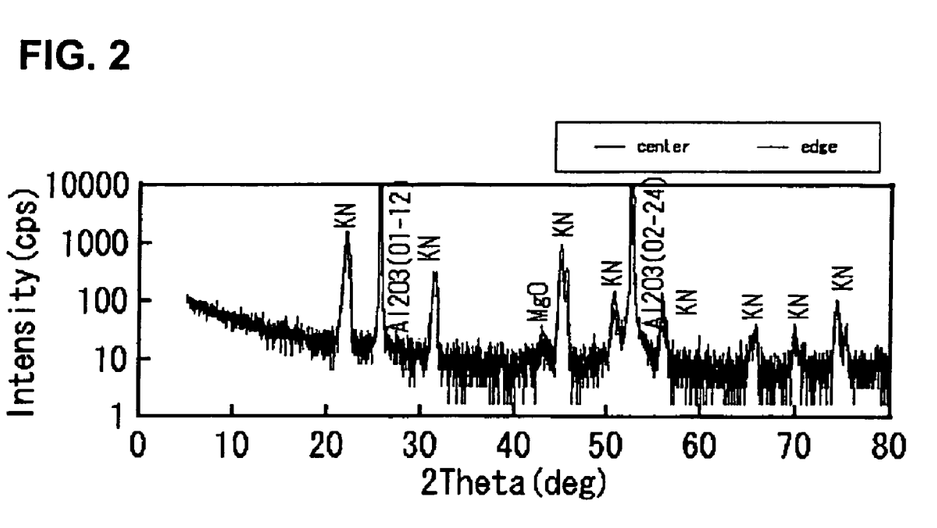
FIG. 2 is an X-ray diffraction diagram of potassium niobate obtained in accordance with an embodiment of the present invention.

An X-ray diffraction pattern (2θ-θ scanning) of the potassium niobate layer in the potassium niobate deposited body obtained in the present embodiment example is shown in FIG. 2. All peaks shown in the X-ray diffraction pattern of FIG. 2 belong to sapphire and potassium niobate, and peaks belonging to other compounds are not observed. Therefore, it was confirmed that the potassium niobate layer obtained in the present embodiment example was a polycrystal but in a single phase.

(2) Second Embodiment Example

A potassium niobate deposited body was formed by the following method. In this embodiment example, a single crystal potassium niobate layer could be obtained.

First, a sapphire single crystal substrate was degreased and washed through soaking the sapphire single crystal substrate in an organic solvent with an ultrasonic washing machine. As the organic solvent, a 1:1 mixed solution of ethyl alcohol and acetone was used. After loading the sapphire single crystal substrate that had been degreased and washed onto a substrate holder, it was introduced together with the substrate holder in a vacuum apparatus whose back pressure at room temperature was 1×10$^{-8}$ Torr, oxygen gas was introduced such the oxygen partial pressure became 5×10$^{-5}$ Torr, and then the substrate was heated to elevate its temperature up to 400° C. at a rate of 20° C./minute with an infrared ray lamp. At this time, as shown in FIG. 3(A), in a pattern obtained by the reflection high speed electron beam diffraction (Reflection High Energy Electron Diffraction (RHEED)) in a sapphire [11-20] direction, kikuchi lines and strong reflection points that are characteristic to a single crystal were observed.

Next, a pulsed beam of KrF excimer laser (with a wavelength of 248 nm) was injected in a surface of a magnesium target under conditions with an energy density being 2.5 J/cm$^2$, a frequency being 20 Hz, and a pulse length being 10 ns, thereby generating a plasma plume of magnesium on the target surface. The plasma plume was irradiated to the sapphire single crystal substrate at a position 70 mm away from the target for 30 minutes under conditions with a substrate temperature being 400° C. and an oxygen partial pressure being 5×10$^{-5}$ Torr, whereby a buffer layer consisting of MgO was deposited to a thickness of 10 nm.

Figure 3:
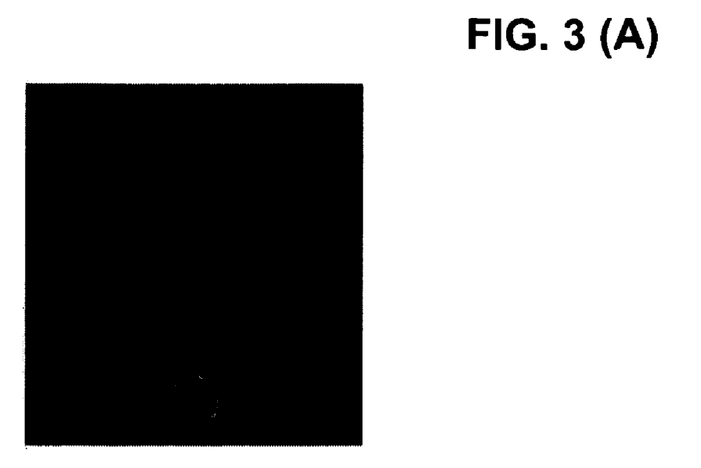
FIGS. 3(A)-(C) are RHEED patterns of potassium niobate obtained in accordance with an embodiment of the present invention.

A RHEED pattern in a sapphire [11-20] direction of the deposited body thus obtained was investigated, and a pattern shown in FIG. 3(B) was obtained. A diffraction pattern appears in this RHEED pattern, and it was confirmed that the buffer layer of MgO epitaxially grew.

Next, a pulsed beam of KrF excimer laser was injected in a surface of a K$_{0.67}$Nb$_{0.33}$O$_y$ target under conditions with an energy density being 2 J/cm$^2$, a frequency being 10 Hz, and a pulse length being 10 ns, thereby generating a plasma plume of K, Nb and O. The plasma plume was irradiated to the sapphire single crystal substrate at a position 70 mm away from the target for 240 minutes under conditions with a substrate temperature being 600° C. and an oxygen partial pressure being 1×10$^{-2}$ Torr, whereby a potassium niobate (KNbO$_3$) layer was deposited to a thickness of 0.5 μm on the buffer layer.

A RHEED pattern in a sapphire [11-20] direction of the deposited body thus obtained was investigated, and a pattern shown in FIG. 3(C) was obtained. A diffraction pattern clearly appeared in this pattern, and it was confirmed that potassium niobate epitaxially grew.

Figure 4:
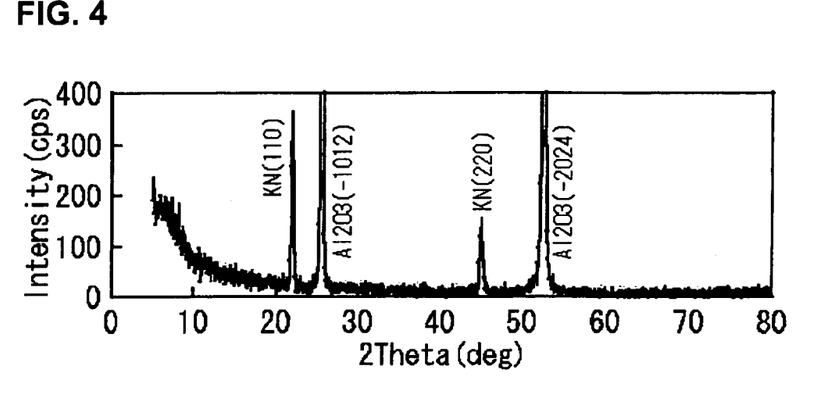
FIG. 4 is an X-ray diffraction diagram of potassium niobate obtained in accordance with an embodiment of the present invention.

Further, an X-ray diffraction pattern (2θ-θ scanning) of the potassium niobate (KNbO$_3$) layer of the laminated body obtained is shown in FIG. 4. It was confirmed from the X-ray diffraction pattern in FIG. 4 that only KNbO$_3$ (110) and KNbO$_3$ (220) peaks were observed besides peaks of the sapphire substrate, and that KNbO$_3$ was (110) oriented.

Figure 5:
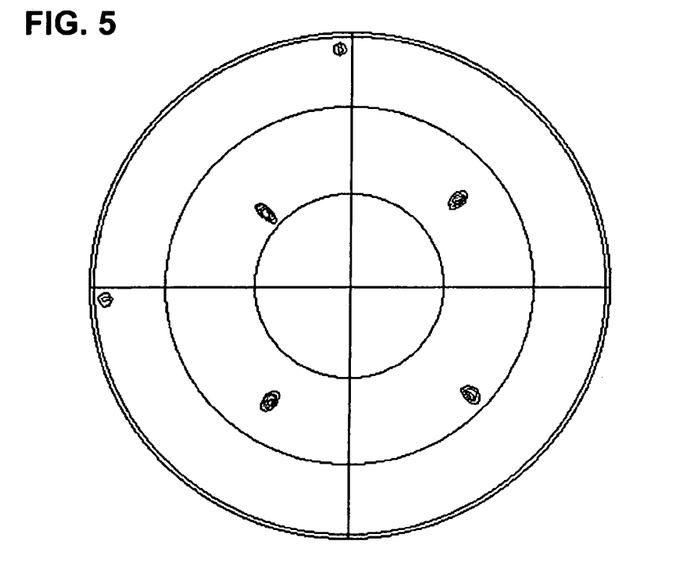
FIG. 5 is an X-ray diffraction diagram pole figure of potassium niobate obtained in accordance with an embodiment of the present invention.

Moreover, when an X-ray diffraction pole figure of a KNbO$_3$ (010) peak was measured, the result shown in FIG. 5 was obtained. In FIG. 5, spots indicating symmetry four times are observed at 30 degrees <Psi<60 degrees, and therefore it was found that the KNbO$_3$ layer had undergone epitaxial growth in an (110) orientation, and had two domains whose [001] axes are different by 90 degrees in the in-plane orientation existed therein. Also, as the center of these four spots is shifted from the center of the pole figure (Psi=0 degree) by 10 degrees, it was confirmed that the KNbO$_3$ layer had epitaxially grown in a state in which its [110] vector was inclined by about 10 degrees with respect to a normal vector of the sapphire R-plane (1-102).

Next, after the temperature of the substrate was lowered to 300° C., a pulsed beam of KrF excimer laser was injected in a surface of a SrRuO$_3$ target under conditions with an energy density being 3 J/cm$^2$, a frequency being 10 Hz, and a pulse length being 10 ns, thereby generating a plasma plume of Sr, Ru and O. The plasma plume was irradiated to the sapphire single crystal substrate at a position 70 mm away from the target for 60 minutes under conditions with a substrate temperature being 300° C. and an oxygen partial pressure being 1×10$^{-2}$ Torr, whereby an electrode layer consisting of a SrRuO$_3$ layer was deposited to a thickness of 100 nm.

Then, a silicon substrate was bonded to the electrode layer by using epoxy adhesive, and then the buffer layer consisting of MgO was etched with a phosphoric acid solution, whereby the sapphire single crystal substrate was separated. In this manner, a potassium niobate deposited body in which the electrode layer and the potassium niobate layer are successively deposited on the silicon substrate was obtained.

According to the present embodiment as described above, when a potassium niobate layer 13 is formed by using a vapor phase method, a single phase thin film of potassium niobate can be epitaxially grown in a c-axis orientation, by using an R-plane sapphire single crystal substrate 11 and a buffer layer 12 consisting of MgO with a cubic (100) orientation. By using the potassium niobate layer 13, a piezoelectric thin film resonator having a large electromechanical coupling coefficient can be obtained. Therefore, by applying this piezoelectric thin film resonator, further miniaturization of frequency filters and frequency oscillators can be realized, and power saving of electronic circuits and electronic apparatuses becomes possible.

Furthermore, in accordance with the present embodiment, after the potassium niobate layer 13 is formed, the potassium niobate layer 13 does not have to be exposed to a high temperature, such that compositions of the electrode layer would not deteriorate the potassium niobate layer through diffusion.

2. Piezoelectric Thin Film Resonator

Figure 6:
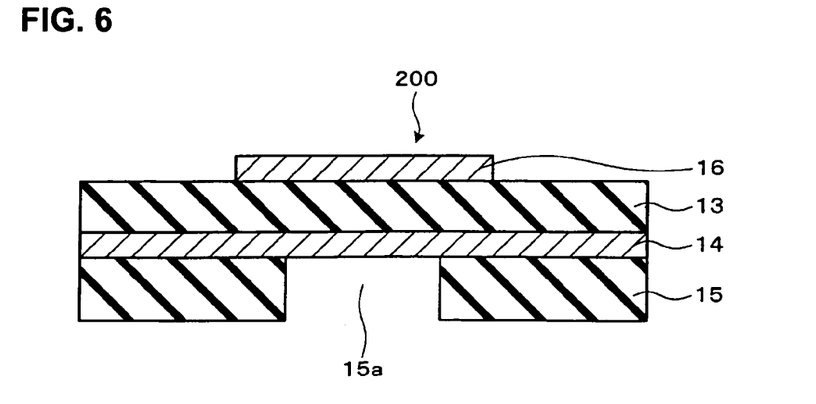
FIG. 6 is a cross-sectional view of a piezoelectric thin film resonator in accordance with an embodiment of the present invention.

FIG. 6 is a cross-sectional view schematically showing a piezoelectric thin film resonator 200 in accordance with an embodiment of the present invention. Members shown in FIG. 6 that are substantially the same as the members of the potassium niobate deposited body 100 shown in FIG. 1(E) are appended with the same reference numbers.

The piezoelectric thin film resonator 200 is formed from a substrate 15 having a void section 15a, a first electrode layer 14 formed on the substrate 15, a potassium niobate layer 13 formed on the first electrode layer 14, and a second electrode layer 16 formed on the potassium niobate layer 13. Further, the first electrode layer 14 and the second electrode layer 16 are located at least above the void section 15a. The first electrode layer 14 is exposed through the void section 15a.

The piezoelectric thin film resonator 200 of the present embodiment is formed through processing a potassium niobate deposited body in accordance with the present invention, for example, the potassium niobate laminated body 100 (see FIG. 1(E)) described in Section 1, as described below. Accordingly, the potassium niobate layer 13 that composes the piezoelectric thin film resonator 200 has the same characteristics as those of the potassium niobate layer 13 of the potassium niobate laminated body 100.

The potassium niobate layer 13 is formed from a polycrystal or single crystal potassium niobate, as described in Section 1. In the present embodiment, sodium potassium niobate tantalate solid solution (K$_{1-x}$Na$_x$Nb$_{1-y}$Ta$_y$O$_3$ (0<x<1, 0<y<1)) can be used instead of potassium niobate (KNbO$_3$). The same similarly applies to each element described below.

For the first electrode layer 14, a material similar to the one described in Section 1 can be used. For the second electrode 16, a material similar to that of the first electrode layer 14 can be used, without being particularly limited, and for example, Pt, Ir, Al, Au, Cu or the like may preferably be used.

The piezoelectric thin film resonator 200 can be formed by using a potassium niobate deposited body in accordance with an embodiment as follows, for example.

First, a resist layer (not shown) is formed by lithography and etching on the surface of the substrate 15 of the potassium niobate deposited body 100 (see FIG. 1(E)) in accordance with the present embodiment. The resist layer has an opening section in an area where a void section is formed. Next, by using the resist layer as a mask, the substrate 15 is anisotropically etched to form a void section 15a. The etching method is not particularly limited, and may be selected according to the material of the substrate 15, and a known dry etching method or wet etching method can be used.

Then, a resist layer (not shown) is formed on the surface of the potassium niobate layer 13 by lithography and etching. The resist layer has an opening section in an area where a second electrode layer is formed. Then, a platinum layer is formed by sputtering, for example, and then a second electrode layer 16 is formed by a lift-off method. At this time, the second electrode layer 16 is located above the void section 15a, and is formed to cover the void section 15a as viewed in a plan view.

An example of experiments conducted on the piezoelectric thin film resonator in accordance with the present embodiment is described below.

First, a piezoelectric thin film resonator was formed by using the potassium niobate deposited body of the first embodiment example described in Section 1.3 (1). The potassium niobate deposited body had a polycrystal potassium niobate layer of a single phase. Piezoelectric oscillations between the first electrode layer and the second electrode layer of the piezoelectric thin film resonator were measured. As a result, an acoustic velocity obtained from the oscillation frequency was 5000 m/s. Also, an electromechanical coupling coefficient obtained based on the resonant frequency and antiresonant frequency was 0.30.

Also, a piezoelectric thin film resonator using sodium potassium niobate tantalate solid solution (K$_{1-x}$Na$_x$Nb$_{1-y}$Ta$_y$O$_3$ (0<x<1, 0<y<1)) instead of potassium niobate (KNbO$_3$) gave similar effects.

Also, a piezoelectric thin film resonator was formed by using the potassium niobate deposited body of the second embodiment example described in Section 1.3 (2). The potassium niobate deposited body had a single crystal potassium niobate layer. Piezoelectric oscillations between the first electrode layer and the second electrode layer of the piezoelectric thin film resonator were measured. As a result, an acoustic velocity obtained from the oscillation frequency was 5000 m/s. Also, an electromechanical coupling coefficient obtained based on the resonant frequency and antiresonant frequency was 0.40. As compared to the electromechanical coupling coefficient obtained when the polycrystal potassium niobate layer was used, it became clear that the electromechanical coupling coefficient improved when the potassium niobate layer was epitaxially grown in a (001) orientation.

3. Frequency Oscillator and Frequency Filter

Figure 7:
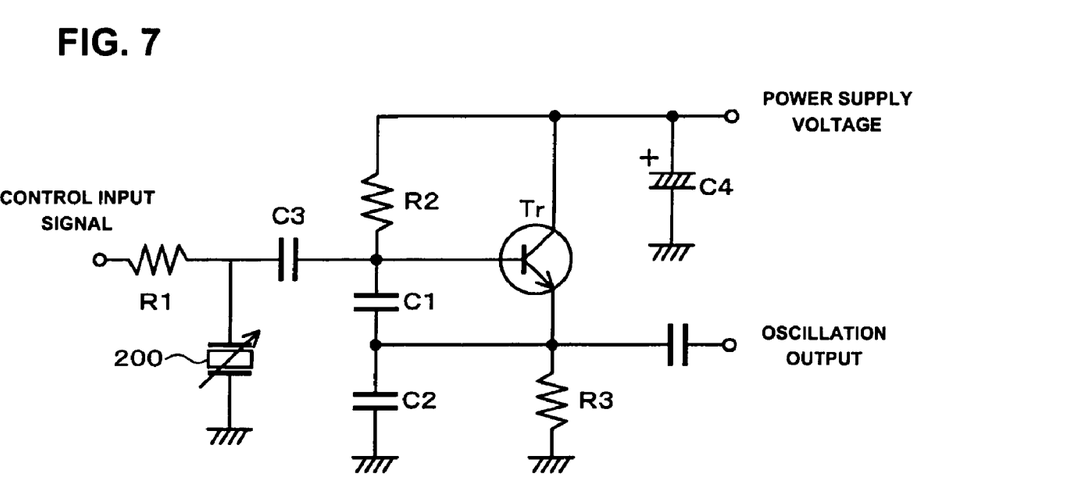
FIG. 7 is a block diagram of a circuit structure of a frequency oscillator in accordance with an embodiment of the present invention.

FIG. 7 is a block diagram of a circuit structure of a frequency oscillator in accordance with an embodiment of the present invention. FIG. 7 shows an exemplary structure of a voltage controlled oscillator (VCO) that uses a piezoelectric thin film resonator in accordance with the present invention, in which the piezoelectric thin film resonator is used as a frequency-variable type. This circuit composes a Colpitts type oscillator with a transistor Tr and several passive components around the transistor. The base of the transistor Tr is connected to a piezoelectric thin film resonator 200 through a capacitor C3. The piezoelectric thin film resonator 200 is also grounded. When a DC voltage for frequency control is applied to the piezoelectric thin film resonator 200 through a resistance R1, the resonant frequency and antiresonant frequency change according to the magnitude of the voltage. Therefore, the oscillation frequency of the oscillation circuit that is determined by these frequencies and capacitors C1, C2, and C3 can be changed.

Also, the piezoelectric thin film resonator in accordance with the present invention can be used as a frequency filter that can control the passband region with voltages by changing DC voltages. In this case, the frequency filter may be composed of a plurality of frequency-variable piezoelectric thin film resonators and frequency control terminals. When a DC voltage is applied to the frequency control terminals, the DC voltage is impressed to each of the piezoelectric thin film resonators, such that the resonance frequency and antiresonant frequency of the resonator change accordingly, and the pass frequency band of the frequency filter can be changed.

Figure 8:
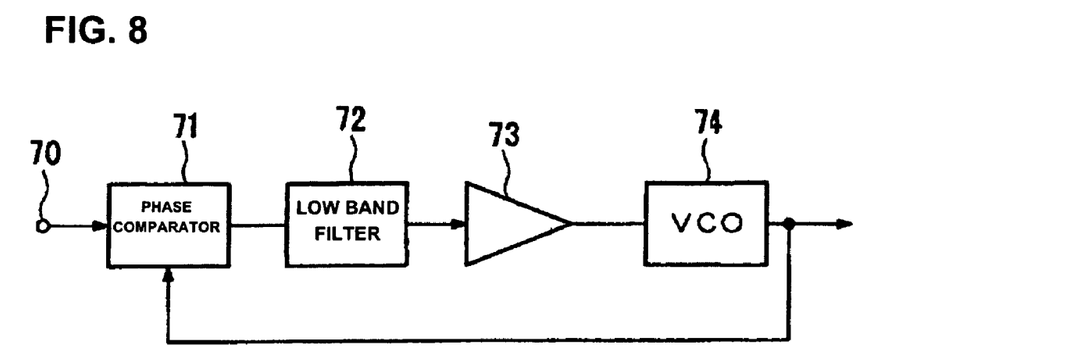
FIG. 8 is a block diagram of the basic structure of a PLL circuit.

The VCO described above can be employed as a VCO for a PLL circuit shown in FIG. 8, for example. The PLL circuit is now briefly explained. FIG. 8 is a block diagram showing the basic structure of a PLL circuit. As shown in FIG. 8, the PLL circuit consists of a phase comparator 71, a low band filter 72, an amplifier 73 and a VCO 74.

The phase comparator 71 compares the phases (or frequencies) of signals inputted from an input terminal 70 and outputted from the VCO 74, and outputs an error voltage signal, the value of which is set according to the difference between these signals. The low band filter 72 transmits only the low frequency components at the position of the error voltage signal outputted from the phase comparator 71, and the amplifier 73 amplifies the signal outputted from the low band filter 72. The VCO 74 is an oscillator circuit in which the oscillation frequency is continuously changed within a region, corresponding to the voltage value inputted. The PLL circuit operates so as to decrease the difference between the phases (or frequencies) inputted from the input terminal 70 and outputted from the VCO 74, and synchronizes the frequency of the signal outputted from the VCO 74 with the frequency of the signal inputted from the input terminal 70. When they are synchronized, the PLL circuit outputs a signal that matches with the signal inputted from the input terminal 70 after excluding a specific phase difference, and conforms to the changes in the input signal.

4. Electronic Circuit 4.1 First Example

Figure 9:
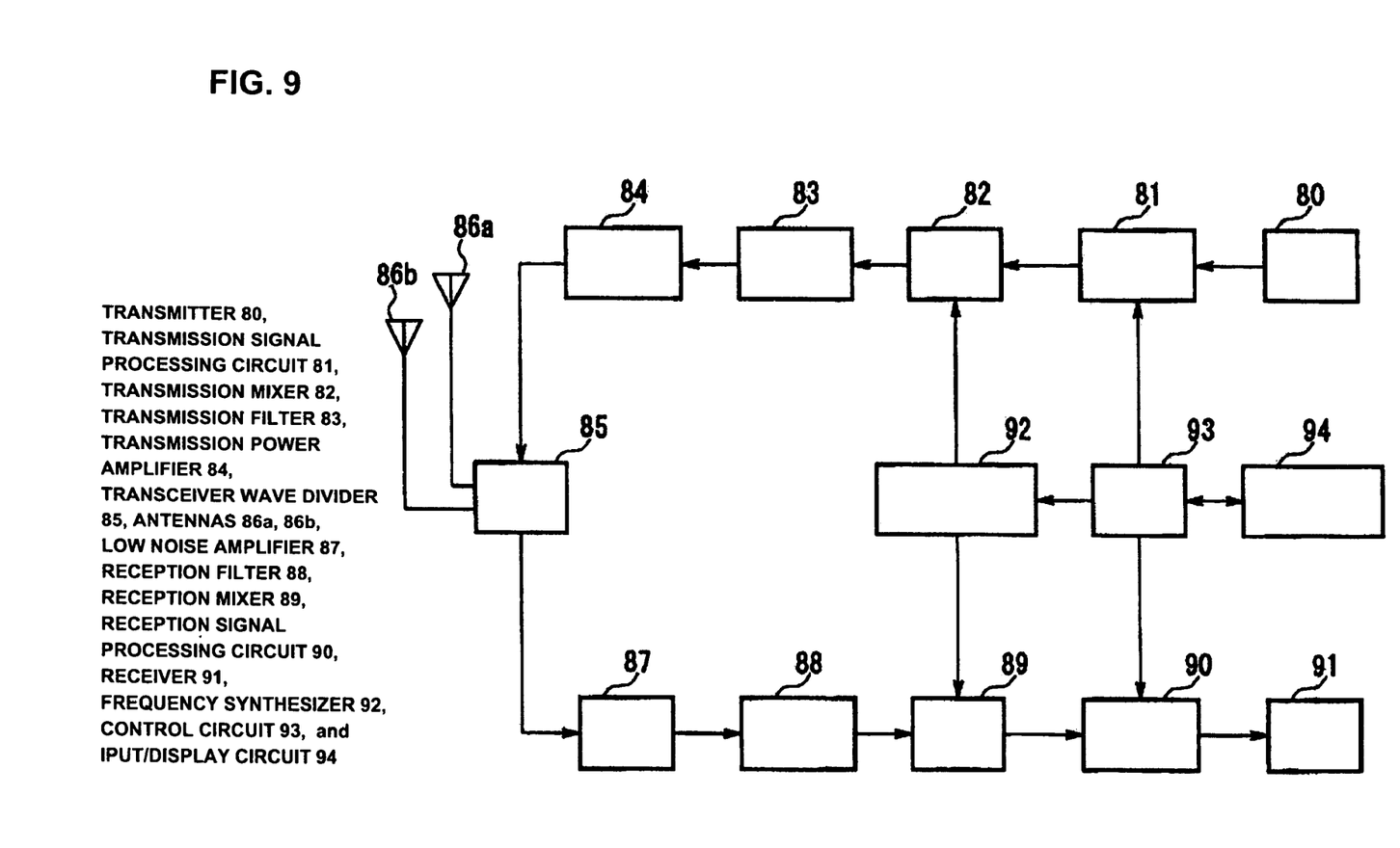
FIG. 9 is a block diagram showing the electric structure of an electronic circuit in accordance with an embodiment of the present invention.
Figure 10:
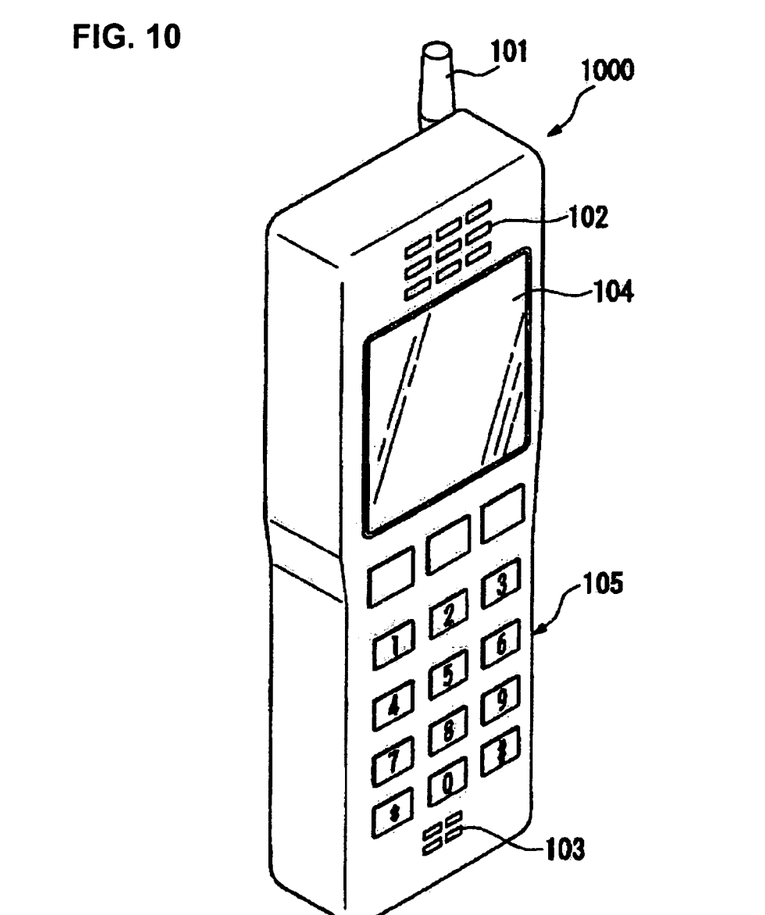
FIG. 10 is a perspective view of the external appearance of a cellular phone as one example of an electronic apparatus in accordance with an embodiment of the present invention.

FIG. 9 is a block diagram showing an electrical structure of an electronic circuit in accordance with an embodiment of the present invention. It is noted that the electronic circuit in FIG. 9 is a circuit that is provided inside a cellular phone 1000 shown in FIG. 10, for example. FIG. 10 is a perspective view showing an example of the external appearance of the cellular phone which is shown here as one example of an electronic apparatus in accordance with an embodiment of the present invention. The cellular phone 1000 shown in FIG. 10 consists of an antenna 101, a receiver 102, a transmitter 103, a liquid crystal display 104, operating buttons 105, and the like.

The electronic circuit shown in FIG. 9 has the basic structure of an electronic circuit provided inside the cellular phone 1000, and is equipped with a transmitter 80, a transmission signal processing circuit 81, a transmission mixer 82, a transmission filter 83, a transmission power amplifier 84, a transceiver wave divider 85, antennas 86*a*, 86*b*, a low noise amplifier 87, a reception filter 88, a reception mixer 89, a reception signal processing circuit 90, a receiver 91, a frequency synthesizer 92, a control circuit 93, and an input/display circuit 94. It is noted that the cellular phones currently in use have a more complicated circuit structure due to the fact that they perform frequency converting processes multiple times.

The transmitter 80 can be realized with a microphone which converts sound wave signals into electric signals, for example, and may correspond to the transmitter 103 shown in FIG. 10. The transmission signal processing circuit 81 is a circuit for performing such processing as D/A conversion, modulation, etc. on the electric signal to be outputted from the transmitter 80. The transmission mixer 82 mixes the signal outputted from the transmission signal processing circuit 81 using the signal outputted from the frequency synthesizer 92. It is noted that the frequency of the signal supplied to the transmission mixer 82 is 380 MHz, for example. The transmission filter 83 permits passage of only those signals of the required frequency from among the intermediate frequencies (hereafter referred to as "IF"), and cuts unnecessary frequency signals. It is noted that the signal outputted from the transmission filter 83 is converted to an RF signal by a converting circuit (not shown). The frequency of this RF signal is about 1.9 GHz, for example. The transmission power amplifier 84 amplifies the power of the RF signal outputted from the transmission filter 83 and outputs this amplified result to the transceiver wave divider 85.

The transceiver wave divider 85 transmits the RF signal that is outputted from the transmission power amplifier 84 through the antennas 86*a* and 86*b* in the form of radio waves. Also, the transceiver wave divider 85 divides the reception signal received by the antennas 86*a* and 86*b*, and outputs the result to the low noise amplifier 87. It is noted that the frequency of the reception signal outputted from the transceiver wave divider 85 is, for example, about 2.1 GHz. The low noise amplifier 87 amplifies the reception signal from the transceiver wave divider 85. It is noted that the signal outputted from the low noise amplifier 87 is converted to an intermediate signal (IF) by a converting circuit (not shown).

The reception filter 88 permits passage of only those signals of the required frequency from among the intermediate frequencies (IF) that are converted by a converting circuit (not shown), and cuts unnecessary frequency signals. The reception mixer 89 employs the signal outputted from the frequency synthesizer 92 to mix the signals outputted from the transmission signal processing circuit 81. It is noted that the intermediate frequency supplied to the reception mixer 89 is, for example, about 190 MHz. The reception signal processing circuit 90 performs such processing as A/D conversion, modulation, etc., to the signal outputted from the reception mixer 89. The receiver 91 is realized by means of a small speaker which converts electric signals into sound waves, for example, and corresponds to the receiver 102 shown in FIG. 10.

The frequency synthesizer 92 is a circuit for generating the signal (at a frequency of 380 MHz, for example) to be supplied to the transmission mixer 82 and the signal (at a frequency of 190 MHz, for example) to be supplied to the reception mixer 89. The frequency synthesizer 92 is equipped with a PLL circuit for generating a signal oscillating at 760 MHz, for example. The frequency synthesizer 92 divides the signal outputted from this PLL circuit and generates a 380 MHz frequency signal, for example, and then further divides this signal to generate a 190 MHz signal.

The control circuit 93 controls the transmission signal processing circuit 81, the reception signal processing circuit 90, the frequency synthesizer 92, and the input/display circuit 94, thereby controlling the overall operation of the cellular phone. The input/display circuit 94 displays the device status to the user of the cellular phone 1000, and is provided for the user to input directions. This input/display circuit 94 corresponds, for example, to the liquid crystal display 104 and the operating buttons 105 shown in FIG. 10.

In an electronic circuit of the above-described structure, the frequency filter described above is employed as the transmission filter 83 and the reception filter 88. The frequency that is filtered (i.e., the frequency which is permitted to pass through the filter) is set separately at the transmission filter 83 and the reception filter 88 in response to the required frequency in the signal outputted from the transmission mixer 82 and the required frequency at the reception mixer 89. The PLL circuit that is provided within the frequency synthesizer 92 is provided with the frequency oscillator shown in FIG. 7 as the VCO 74 of the PLL circuit shown in FIG. 8.

4.2 Second Example

Figure 12:
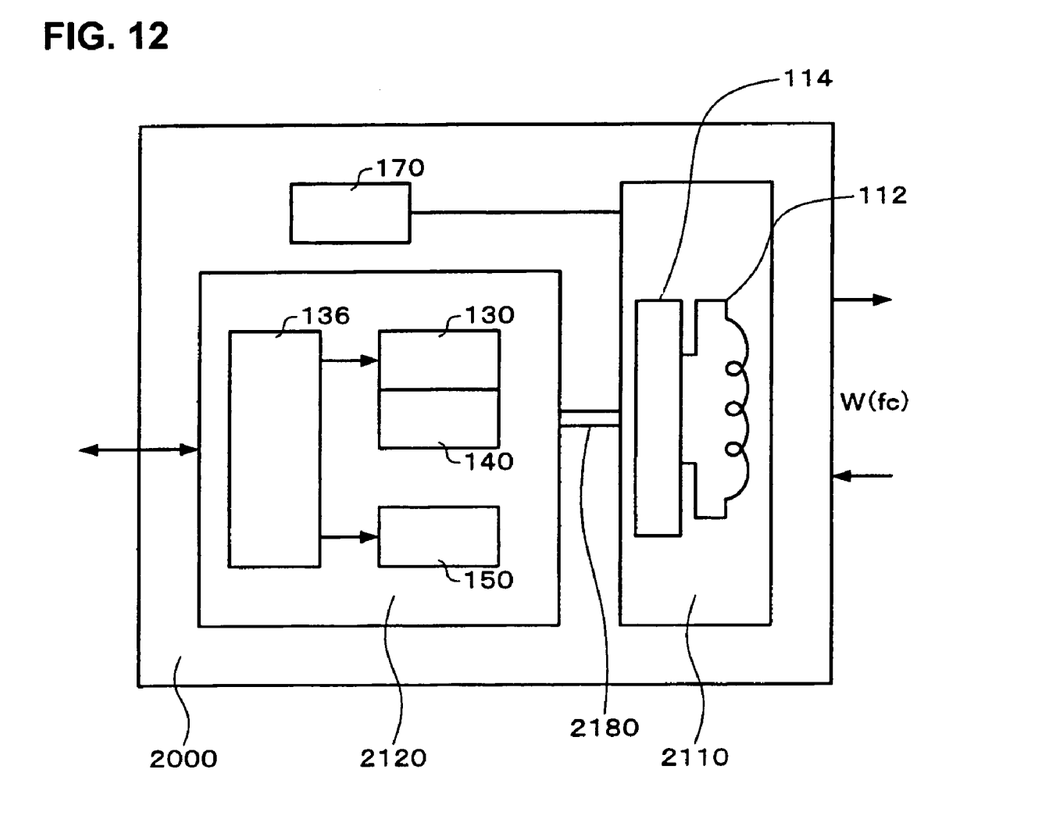
FIG. 12 is a block diagram schematically showing the reader/writer shown in FIG. 11.
Figure 13:
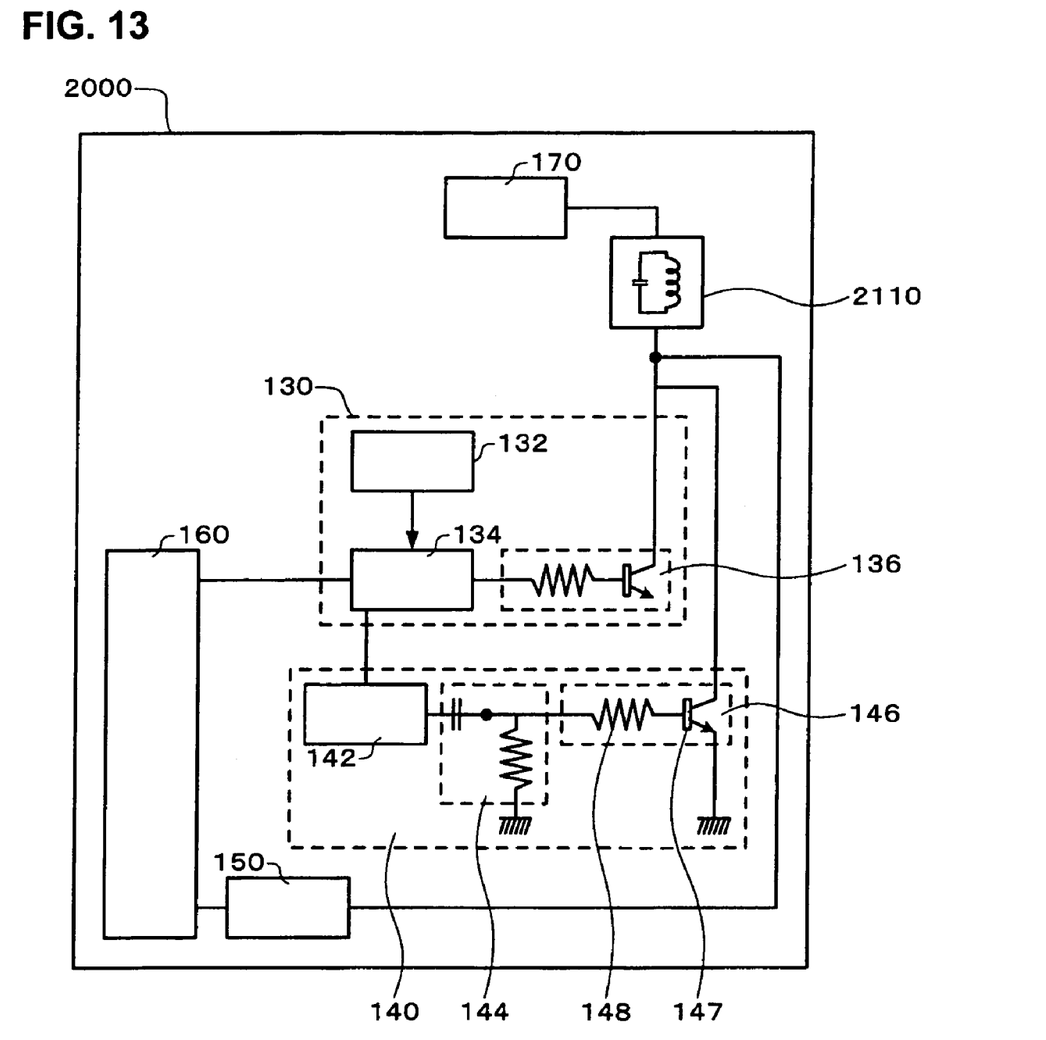
FIG. 13 is a circuit diagram showing the structure of the reader/writer shown in FIG. 11.

FIG. 13 is a block diagram showing the electrical structure of an electronic circuit in accordance with an embodiment of the present invention. It is noted that the block diagram shown in FIG. 13 may be a circuit diagram of a circuit that is provided in, for example, a reader/write 2000 shown in FIG. 11 and FIG. 12.

Figure 11:
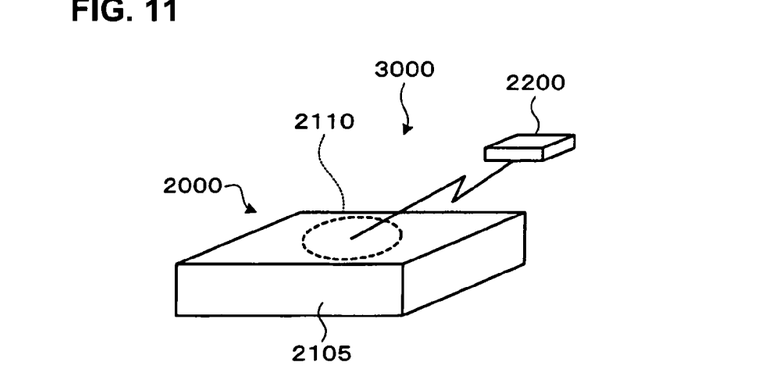
FIG. 11 is a view showing a communications system that uses a reader/writer in accordance with an embodiment of the present invention.

A reader/writer 2000 and a communications system 3000 using the same are described with reference to FIGS. 14-16 as examples of electronic apparatuses in accordance with embodiments of the present invention. The communications system 3000 includes the reader/writer 2000 and contactless information medium 2200, as shown in FIG. 11. FIG. 12 is a block diagram schematically showing the reader/writer in FIG. 11. FIG. 13 is a circuit diagram schematically showing the structure of the reader/writer 2000 shown in FIG. 12.

The reader/writer 2000 transmits a radio wave W (which may also be hereafter referred to as a "career") having a carrier frequency $f_c$ to the contactless information medium 2200 or receives the same from the contactless information medium 2200, to thereby communicate with the contactless information medium 2200 by using radio communications. The radio wave W can use any carrier frequency fc in an arbitrary frequency band (for example, 13.56 MHz). As shown in FIG. 11 and FIG. 12, the reader/writer 2000 has a main body 2105, an antenna section 2110 located on the top surface of the main body 2105, a control interface section 2120 stored in the main body 2105, and a power supply circuit 170. The antenna 2110 and the control interface section 2120 are electrically connected with a cable 2180. Further, the reader/writer 2000 is connected to an external host device (processor, controller device, personal computer, display, etc.) (not shown) through the control interface section 2120.

The antenna section 2110 has a function to communicate information with the contactless information medium 2200. The antenna section 2110 is located on the upper surface of the communication device 2000, and has a prescribed communication area (area shown by a dotted line in the figure), as shown in FIG. 11. The antenna section 2110 is composed of a loop antenna 112 and a matching circuit 114.

A transmission section 130, a damping oscillation cancellation section (hereafter, referred to as a "cancellation section") 140, a reception section 150, and a controller 160 are built into the control interface section 2120.

The transmission section 130 modulates data transmitted from an external unit (not shown), and transmits the same to the loop antenna 112.

The transmission section 130 has an oscillation circuit 132, a modulation circuit 134, and a driving circuit 136. The oscillation circuit 132 is a circuit for generating a carrier of a prescribed frequency, and is usually composed by the use of a quartz oscillator or a ceramic oscillator. Further, by using a frequency oscillator in accordance with the present invention in the oscillation circuit 132, its communication frequency can be improved to a higher frequency and its detection sensitivity can be improved.

The modulation circuit 134 is a circuit that modulates the carrier according to information given, and can be composed of, for example, ordinary CMOS AND gate circuits. In this case, as the modulation method, an ASK (Amplitude Shift Keying) 100% method that is a kind of an amplitude modulation method may be used. However, other modulation methods, such as, for example, a PSK (Phase Shift Keying) method, a FSK (Frequency Shift Keying) method, or the like can be used. Finally, the driving circuit 136 receives the modulated career, amplifies its electric power, and drives the antenna section 2110. The driving circuit 136 is composed of a resistance and a transistor in the present embodiment. The transmission section 130 described in the present specification is illustrative, and does not exclude applications of an equivalent composition of the same.

The cancellation section 140 has a function to control a damped oscillation generated by the loop antenna 112 of the antenna section 2110 which occurs with ON/OFF of the career. The cancellation section 140 has a logic circuit 142 and a cancellation circuit 146. A transistor 147 to be described below of the cancellation circuit 146 and the transistor of the driving circuit 136 are connected to form a wired OR.

The reception section 150 has a detection device (current detection device) (not shown) and a demodulator circuit, and demodulates a signal that is transmitted from the contactless information medium 2200. In the present embodiment, the detection device is a device that detects changes in the current that circulates in the loop antenna 112, and, for example, can be composed of a well-known current detection device. It is noted that, though the detection device is realized as a current detection device in the present embodiment, it can have any structure that is capable of detecting signals transmitted from the contactless informational medium 2200. Moreover, the demodulation circuit is a circuit that demodulates a change detected by the current detection device, but does not exclude applications of any known technology.

The controller 160 retrieves information from the demodulated signal, and transfers the same to an external device. The controller 160 may be composed of, for example, a CPU, and may be a different control and/or processing circuit.

The power supply circuit 170 receives the supply of an electric power from outside, appropriately converts the voltage, and supplies a necessary electric power to each circuit, but may use a built-in battery as the power source depending on circumstances. The power supply circuit 170 drives the antenna 2110 with a power supply of 15V in the present embodiment. Any well-known technology is applicable to the power supply circuit 170, and its detailed description here is omitted.

Referring again to FIG. 11, the contactless information medium 2200 that can communicate with the above-described reader/writer 2000 is described.

The contactless information medium 2200 communicates with the reader/writer 2000 by using electromagnetic waves (radio waves). In accordance with present embodiment, the contactless information medium 2200 can have any arbitrary configuration (for example, a pendant shape, coin shape, key shape, card shape, tag shape or the like) that matches with its use, and is realized as a contactless IC tag (which is interchangeably referred to as a contactless IC tag 2200). However, the contactless information medium 2200 may be realized as an IC card having a so-called ISO (International Organization for Standardization) size (54 mm in length, 85.6 mm in width, and 0.76 mm in thickness) IC card that is in the same size as a credit card. Such IC cards do not exclude applications of the medium to card media that has magnetic stripes such as credit cards and cash cards. Furthermore, the contactless information medium 2200 may be selectively provided with an embossment, a signature panel, a hologram, a stamp, a hot stamp, an image print, a photograph, etc.

Next, operations of the communications system 3000 that uses the reader/writer 2000 in accordance with the present embodiment are described. When data is sent to the contactless IC tag 2200 from the reader/writer 2000, if the data is sent from an external device (not shown), the data is processed by the controller 160 in the reader/writer 2000 and sent to the transmission section 130. In the transmission section 130, a high frequency signal of a constant amplitude is supplied from the oscillation circuit 132 as a career, the career is modulated by the data and a modulated high frequency signal is outputted. In this case, the modulation method can be an amplitude modulation method, a frequency modulation method, a phase modulation method, or the like. The modulated high frequency signal outputted from the modulation circuit 134 is supplied to the antenna 2110 through the driving circuit 136.

In the present embodiment, at the same time, the damping oscillation cancellation section 140 generates a predetermined pulse signal in synchronism with an OFF timing of the modulated high frequency signal, to thereby contribute to the control of the damping oscillation in the loop antenna 112. As a result, the reader/writer 2000 can obtain excellent communications with the contactless information medium 2200.

At this time, as the reader/writer 2000 is adjacent to the contactless IC tag 2200, the loop antenna 112 of the reader/writer 2000 and a coil (not shown) of the contactless IC tag 2200 are electromagnetically coupled with one another.

Then, in the contactless IC tag 2200, the modulated high frequency signal is supplied to a reception circuit (not shown). Also, the modulated high frequency signal is supplied to a power supply circuit (not shown), and a predetermined power supply voltage (for instance, 3.3 V) necessary for each section of the contactless IC tag 2200 is generated. Moreover, the data outputted from the reception circuit (not shown) is demodulated and supplied to a logic control circuit (not shown). The logic control circuit (not shown) operates based on the output of a clock (not shown), processes the supplied data, and writes certain data in a memory (not shown).

When data is sent from the contactless IC tag 2200 to the reader/writer 2000, the following operations take place. In the reader/writer 2000, a high frequency signal of a constant amplitude is outputted without being modulated from the modulation circuit 134, and sent to the contactless IC tag 2200 through the driving circuit 136 and the loop antenna 112 of the antenna section 2110.

On the other hand, in the contactless IC tag 2200, data read from the memory (not shown) is processed by the logic control circuit (not shown), and supplied to a transmission and reception circuit (not shown). A transmission circuit (not shown) of the transmission and reception circuit (not shown) can be composed of, for example, a load resistance and a switch, wherein the switch turns ON and OFF according to "1" and "0" bit of the data.

In the reader/writer 2000, when the switch of the transmission circuit (not shown) of the transmission and reception circuit turns ON and OFF, the load, as viewed to the side of the loop antenna 112 from the both terminals of the loop antenna 112 of the antenna section 2110, fluctuates, and therefore, the amplitude of the high frequency current that circulates in the loop antenna 112 fluctuates. In other words, the high frequency current is amplitude-modulated by the data supplied from the logic control circuit (not shown) of the contactless IC tag 2200 to the transmission circuit (not shown). The high frequency current is detected by the current detection device (not shown) of the reception section 150, and demodulated by the reception circuit (not shown) whereby data is obtained. The data is processed by the controller 160, and transmitted to an external apparatus (not shown).

The communications system 3000 described above is expected to be used for multiple purposes in various fields as well as contactless IC cards and IC tags. These fields include finance (cash cards, credit cards, electronic money management, firm banking, home banking, etc.), circulation (shopping cards, gift certificates, etc.), medical treatment (consultation cards, health insurance certificates, health pocketbooks, etc.), traffic (stored fair (SF) cards, coupon tickets, license certificates, commutation tickets, passports, etc.), insurance (insurance policy, etc.), bond (bonds, etc.), education (student's identification cards, transcripts, etc.), enterprise (identification cards, etc.), administration (stamp certificates, resident cards, etc.), and the like. For example, when the contactless IC tag 2200 stores ID information in its memory, the communication system 3000 can be used as an input/output control medium for corporations, laboratories, universities and the like.

Although the piezoelectric thin film resonator, frequency filter, frequency oscillator, electronic circuit, and electronic equipment in accordance with the embodiments of the present invention are described above, the present invention can be freely modified within the scope of the present invention without being limited to the embodiments described above. For example, in the embodiments described above, the cellular phone and the communications system that use the reader/writer are described as examples of electronic apparatuses, and the electronic circuits installed in the cellular phone and the reader/writer are described as examples of electronic circuits. However, the present invention is not limited to the above, but can be applied to various mobile telecommunications equipment and electronic circuits installed therein.

Moreover, the present invention can be applied not only to mobile telecommunications equipment, but also to floor type telecommunications equipment such as tuners that receive BS (Broadcast Satellite) and CS (Commercial Satellite) broadcasting, and electronic circuits installed therein. Furthermore, the present invention is applicable not only to telecommunications equipment that use electric waves that propagate through air as communication careers, but also to electronic equipment such as HUB or the like that use high frequency signals that propagate in coaxial cables, optical signals that propagate in optical cables and the like, and electronic circuits installed therein.

In addition, the present invention is also applicable to wide-band filters in UWB systems, wide-band filters of cellular phones, VCSOs and wide-band filters of wireless LAN, and the like.

According to the potassium niobate deposited body in accordance with the present invention described above, piezoelectric thin film resonators having a large electromechanical coupling coefficient can be realized, miniaturization of frequency filters and frequency oscillators can be achieved, and power saving of electronic circuits and electronic apparatuses can be realized.

What is claimed is:

1. A method for manufacturing a potassium niobate deposited body, comprising:
    a step of forming a buffer layer including a metal oxide having a rock salt structure on a first substrate consisting of a sapphire substrate;
    a step of forming at least one of:
        a potassium niobate polycrystal or single crystal layer; and
        a potassium niobate solid solution layer above the buffer layer;
    a step of forming an electrode layer above the potassium niobate layer;
    a step of bonding a second substrate above the electrode layer; and
    a step of isolating the first substrate by removing the buffer layer by etching.

2. A method for manufacturing a potassium niobate deposited body according to claim 1, wherein the potassium niobate layer includes a domain having a polarization axis that is in parallel with the first substrate.

3. A method for manufacturing a potassium niobate deposited body according to claim 1, wherein the potassium niobate layer includes a domain that epitaxially grows in a (110) or (001) orientation, when a lattice constant of orthorhombic potassium niobate is $2^{1/2}$ c<a<b, and a b-axis is a polarization axis.

4. A method for manufacturing a potassium niobate deposited body according to claim 1, wherein the sapphire substrate comprises an R plane (1-102).

5. A method for manufacturing a potassium niobate deposited body according to claim 1, wherein the metal oxide is magnesium oxide.

6. A method for manufacturing a potassium niobate deposited body according to claim 5, wherein the magnesium oxide is epitaxially grown in a cubic (100) orientation.

7. A method for manufacturing a potassium niobate deposited body according to claim 6, wherein a [100] direction vector of the magnesium oxide, and a [110] direction vector of the domain epitaxially grown to a (110) orientation or a [001] direction vector of the domain epitaxially grown to a (001) orientation of the potassium niobate layer are inclined with respect to a normal vector of the R-plane (1-102) of the sapphire substrate.

8. A method for manufacturing a potassium niobate deposited body according to claim 7, wherein a [100] direction vector of the magnesium oxide, and a [110] direction vector of the domain epitaxially grown to a (110) orientation or a [001] direction vector of the domain epitaxially grown to a (001) orientation of the potassium niobate layer are inclined with respect to a normal vector of the R-plane (1-102) of the sapphire substrate at an angle between 1 degree and 20 degrees.

9. A method for manufacturing a potassium niobate deposited body according to claim 1 further comprising the step of polishing a surface of the potassium niobate layer or the potassium niobate solid solution layer.

* * * * *